(12) United States Patent
Obana et al.

(10) Patent No.: US 10,135,412 B2
(45) Date of Patent: Nov. 20, 2018

(54) INFORMATION PROCESSING APPARATUS, STORAGE MEDIUM HAVING STORED THEREIN INFORMATION PROCESSING PROGRAM, INFORMATION PROCESSING SYSTEM, AND INFORMATION PROCESSING METHOD

(71) Applicant: NINTENDO CO., LTD., Kyoto (JP)

(72) Inventors: Kazutoshi Obana, Kyoto (JP); Kochi Kawai, Kyoto (JP); Junichiro Miyatake, Nagaokakyo (JP); Shoji Masubuchi, Kyoto (JP); Kei Yamashita, Kyoto (JP); Takafumi Aoki, Kyoto (JP); Masahiko Inami, Yokohama (JP); Kouta Minamizawa, Yokohama (JP)

(73) Assignee: Nintendo Co., Ltd., Kyoto (JP)

( * ) Notice: Subject to any disclaimer, the term of this patent is extended or adjusted under 35 U.S.C. 154(b) by 0 days.

(21) Appl. No.: 14/641,711

(22) Filed: Mar. 9, 2015

(65) Prior Publication Data

US 2015/0263685 A1 Sep. 17, 2015

(30) Foreign Application Priority Data

Mar. 12, 2014 (JP) .................................. 2014-049131

(51) Int. Cl.
*H03G 3/00* (2006.01)
*H03G 3/30* (2006.01)
*H03G 3/04* (2006.01)

(52) U.S. Cl.
CPC ............. *H03G 3/3005* (2013.01); *H03G 3/04* (2013.01); *H04R 2400/03* (2013.01); *H04R 2499/11* (2013.01)

(58) Field of Classification Search
CPC ................... A63F 13/00; A63F 13/285; A63F 2300/1037; A63F 13/22; A63F 13/24;
(Continued)

(56) References Cited

U.S. PATENT DOCUMENTS 8,468,280 B2 * 6/2013 Paillard ................... A63F 13/02
434/55
8,469,809 B2 * 6/2013 Nakajima ............... A63F 13/00
463/30

(Continued)

FOREIGN PATENT DOCUMENTS

JP 2006-068210 3/2006
JP 2006-079238 * 3/2006 ............. G06F 3/041

OTHER PUBLICATIONS

Office Action dated Sep. 13, 2017 in counterpart Japanese Patent Application No. 2014-049131.
English-language machine translation of JP2006-079238.

*Primary Examiner* — Lun-See Lao
(74) *Attorney, Agent, or Firm* — Nixon & Vanderhye, P.C.

(57) ABSTRACT

An information processing apparatus sets an amount of adjustment for adjusting an output in accordance with a user operation and generates a sound signal so that a sound volume of sound to be output from a sound output apparatus changes in accordance with the set amount of adjustment. Then, the information processing apparatus generates a vibration signal so that a magnitude of vibration to be imparted by a vibration apparatus changes in accordance with the set amount of adjustment.

12 Claims, 8 Drawing Sheets

(58) Field of Classification Search
CPC ........ A63F 13/06; A63F 13/213; A63F 13/60;
A63F 2300/1043; A63F 13/02; A63F
13/0863; A63F 13/2145; A63F 13/23;
A63F 13/235; A63F 13/54; H04R 5/033;
H04R 1/1041; H04R 1/1091; H04R 1/14;
H04R 1/26; H04R 2201/003; H04R
2217/03; H04R 23/00; H04R 2400/03;
H04R 2420/05; H04R 2420/09; H04R
2460/13; H04R 2499/11; H04S 2400/11
USPC ....... 381/104–107, 333, 388, 151, 124, 301,
381/18, 385; 601/49, 57, 70, 47, 149;
434/55

See application file for complete search history.

(56) References Cited

U.S. PATENT DOCUMENTS

| | | | |
|---|---|---|---|
| 2006/0046843 A1 | 3/2006 | Nakajima | |
| 2011/0260996 A1* | 10/2011 | Henricson | G06F 3/016 345/173 |
| 2012/0229382 A1* | 9/2012 | Matsunaga | A63F 13/92 345/158 |
| 2014/0056461 A1* | 2/2014 | Afshar | H04R 1/00 381/385 |

* cited by examiner

F I G. 3
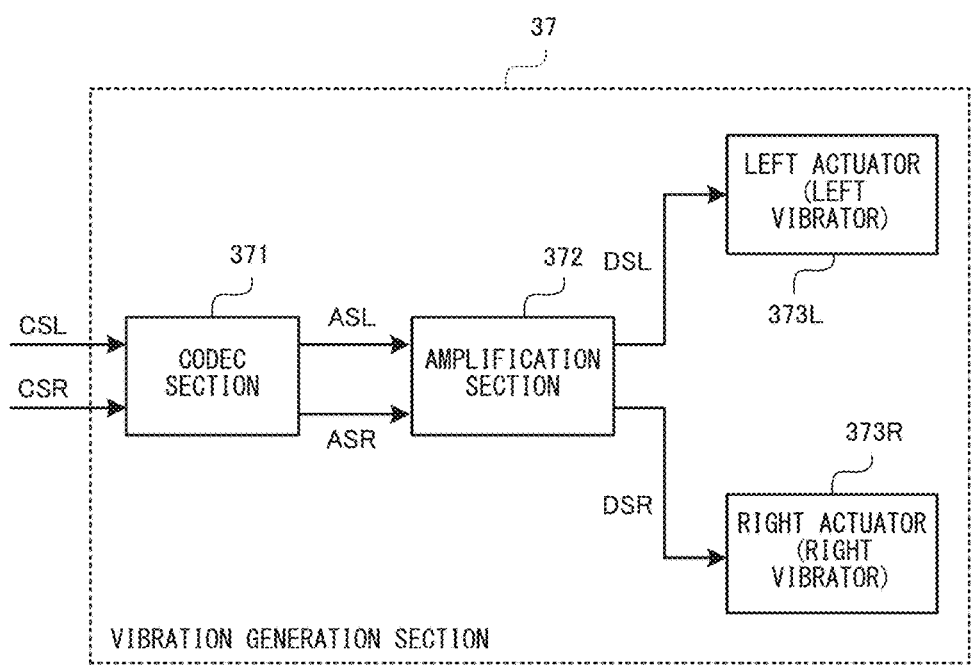

F I G. 4
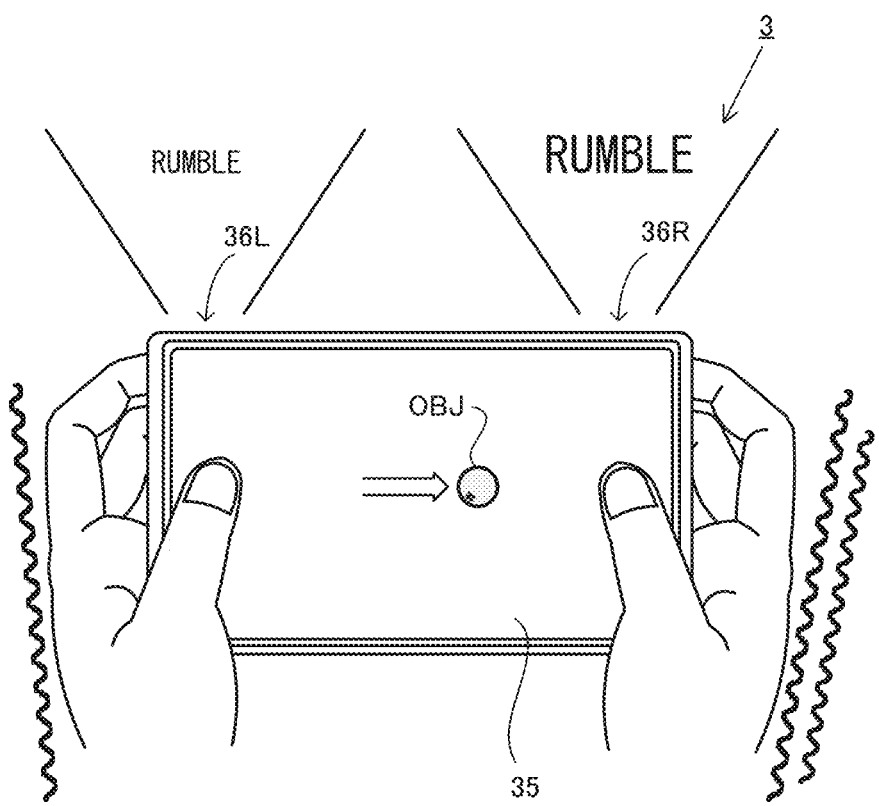
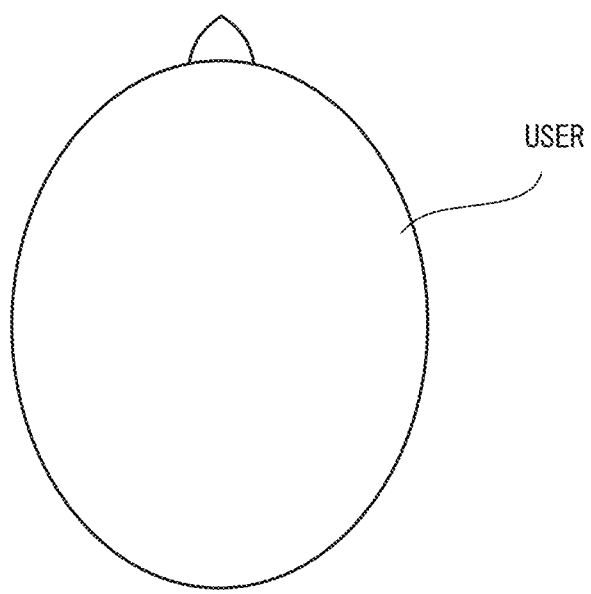

INFORMATION PROCESSING APPARATUS, STORAGE MEDIUM HAVING STORED THEREIN INFORMATION PROCESSING PROGRAM, INFORMATION PROCESSING SYSTEM, AND INFORMATION PROCESSING METHOD

CROSS REFERENCE TO RELATED APPLICATION

The disclosure of Japanese Patent Application No. 2014-049131, filed on Mar. 12, 2014, is incorporated herein by reference.

FIELD

The technology shown here relates to an information processing apparatus, a storage medium having stored therein an information processing program, an information processing system, and an information processing method, and in particular, relates to an information processing apparatus, an information processing system, and an information processing method for, for example, controlling vibrations to be imparted to an apparatus, and a storage medium having stored therein an information processing program for, for example, controlling vibrations to be imparted to an apparatus.

BACKGROUND AND SUMMARY

Conventionally, a game apparatus for imparting vibrations to the main body of the apparatus is known. For example, the game apparatus imparts vibrations to the main body of the apparatus in accordance with the game situation and transmits the vibrations to the fingers and the hands of a user holding the apparatus.

The game apparatus, however, cannot adjust the vibrations to be imparted to the fingers and the hands of the user in accordance with a user's preference.

Therefore, it is an object of an exemplary embodiment to provide an information processing apparatus, an information processing system, and an information processing method that are capable of adjusting vibrations for vibrating a vibration apparatus in accordance with a user operation, and a storage medium having stored therein an information processing program capable of adjusting vibrations for vibrating a vibration apparatus in accordance with a user operation.

To achieve the above object, the exemplary embodiment can employ, for example, the following configurations. It should be noted that it is understood that, to interpret the descriptions of the claims, the scope of the claims should be interpreted only by the descriptions of the claims. If there is a conflict between the descriptions of the claims and the descriptions of the specification, the descriptions of the claims take precedence.

In an exemplary configuration of an information processing apparatus according to an exemplary embodiment, an information processing apparatus outputs sound from a sound output apparatus in accordance with an input of a sound signal and simultaneously vibrates a vibration apparatus in accordance with an input of a vibration signal. The information processing apparatus includes one or more processors configured to: set an amount of adjustment for adjusting an output in accordance with a user operation; generate the sound signal so that a sound volume of sound to be output from the sound output apparatus changes in accordance with the set amount of adjustment; and generate the vibration signal so that a magnitude of vibration to be imparted by the vibration apparatus changes in accordance with the set amount of adjustment.

Based on the above, it is possible to adjust a sound volume and a magnitude of vibration by the same user operation.

In addition, the amount of adjustment may be set in accordance with a volume operation in which a user adjusts the sound volume.

Based on the above, it is possible to adjust the magnitude of vibration in accordance with a volume operation in which a user adjusts the sound volume.

In addition, the vibration signal may be generated so that the magnitude of vibration to be imparted by the vibration apparatus changes in accordance with the amount of adjustment set in accordance with the volume operation.

Based on the above, it is possible to adjust the magnitude of vibration in accordance with the same amount of adjustment as the amount of adjustment by which the user has adjusted the sound volume.

In addition, the sound signal may be generated so that the sound volume of sound to be output from the sound output apparatus increases and/or decreases in accordance with an increase and/or a decrease in the amount of adjustment. The vibration signal may be generated so that an intensity for vibrating the vibration apparatus increases and/or decreases in accordance with the increase and/or the decrease in the amount of adjustment.

Based on the above, it is possible to adjust the magnitude of vibration to increase in accordance with a volume operation in which a user increases the sound volume, and also adjust the magnitude of vibration to decrease in accordance with a volume operation in which the user decreases the sound volume.

In addition, the sound signal and the vibration signal may be generated so that the sound volume and the magnitude of vibration change simultaneously.

Based on the above, it is possible to simultaneously adjust the sound volume and the magnitude of vibration by a user operation.

In addition, the information processing apparatus may further include a data storage unit. The data storage unit stores sound data, which is a source of sound to be output from the sound output apparatus, and vibration data, which is a source of vibration to be imparted by the vibration apparatus. In this case, the sound signal may be generated based on the sound data stored in the data storage unit. The vibration signal may be generated based on the vibration data stored in the data storage unit.

Based on the above, vibration data and sound data prepared in advance are used. This makes it possible to present vibrations and sounds rich in variety.

In addition, the information processing apparatus may further include a single input unit used by a user to adjust the amount of adjustment. In this case, the amount of adjustment may be set in accordance with an operation performed on the input unit.

Based on the above, it is possible to adjust the sound volume and the magnitude of vibration by a user operation using a single input unit.

In addition, even while the sound output apparatus is outputting sound and the vibration apparatus is vibrating, the amount of adjustment may be allowed to be set in accordance with a user operation.

Based on the above, even while a sound output apparatus is outputting sound and a vibration apparatus is vibrating, it is possible to adjust the sound volume and the magnitude of vibration by the same user operation.

In addition, the vibration signal may include a signal in an audible range of frequencies.

Based on the above, it is possible to adjust the production of a vibration sound by adjusting the magnitude of vibration.

In addition, the vibration signal may have a plurality of frequency components.

Based on the above, vibrations, each having a plurality of frequency components, are imparted. This makes it possible to impart vibrations rich in variety to a user.

In addition, the vibration signal for vibrating the vibration apparatus with vibration in a frequency range having a predetermined width may be generated.

Based on the above, vibrations in a frequency range having a predetermined width (e.g., vibrations in which values equal to or greater than a predetermined magnitude continue in at least one frequency range having a predetermined width) are imparted. This makes it possible to impart vibrations rich in variety to a user.

In addition, the exemplary embodiment may be carried out in the form of an information processing program, an information processing system, or an information processing method.

According to the exemplary embodiment, it is possible to adjust the sound volume and the magnitude of vibration by the same user operation.

These and other objects, features, aspects and advantages of the exemplary embodiments will become more apparent from the following detailed description of the exemplary embodiments when taken in conjunction with the accompanying drawings.

BRIEF DESCRIPTION OF THE DRAWINGS

FIG. 3 is a block diagram showing a non-limiting example of the configuration of a vibration generation section 37;

FIG. 4 is a diagram showing a non-limiting example where a game is performed using the information processing apparatus 3;

DETAILED DESCRIPTION OF NON-LIMITING EXAMPLE EMBODIMENTS

With reference to the drawings, an information processing apparatus for executing an information processing program according to an exemplary embodiment is described. While the information processing program according to the exemplary embodiment can be applied by being executed by any computer system, a handheld information processing apparatus 3 (a tablet terminal) is used as an example of the information processing apparatus, and the information processing program according to the exemplary embodiment is described using an information processing program executed by the information processing apparatus 3. For example, the information processing apparatus 3 can execute a program and a pre-installed program (e.g., a game program) stored in a storage medium such as an exchangeable optical disk or an exchangeable memory card, or received from another apparatus. As an example, the information processing apparatus 3 can display on a screen an image generated by a computer graphics process, such as a virtual space image viewed from a virtual camera set in a virtual space. The information processing apparatus 3 may be a device such as a general personal computer, a stationary game apparatus, a mobile phone, a handheld game apparatus, or a PDA (Personal Digital Assistant). It should be noted that FIG. 1 is a plan view of an example of the external appearance of the information processing apparatus 3.

Figure 1:
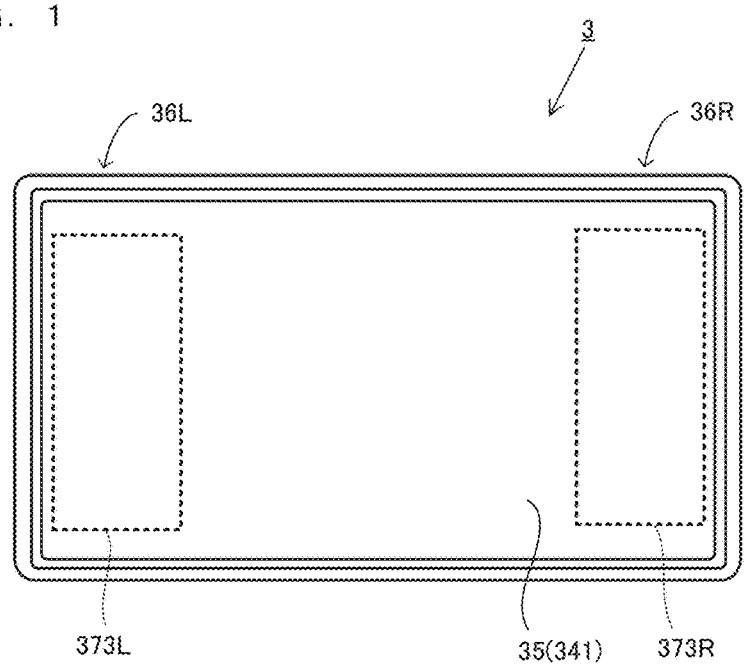
FIG. 1 is a plan view of a non-limiting example of the external appearance of an information processing apparatus 3 according to an exemplary embodiment.

In FIG. 1, the information processing apparatus 3 includes a display section 35, a sound output section 36, and an actuator 373. As an example, the display section 35 is provided on the front surface of the main body of the information processing apparatus 3. For example, the display section 35 includes an LCD (Liquid Crystal Display) and may employ, for example, a display device using EL. Further, the display section 35 may be a display device capable of displaying a stereoscopically viewable image.

A touch panel 341, which is an example of an input section 34, is provided so as to cover a display screen of the display section 35. The touch panel 341 detects the position of an input provided to a predetermined input surface (e.g., the display screen of the display section 35). It should be noted that the input section 34 is an input device that allows a user of the information processing apparatus 3 to input an operation, and the input section 34 may be any input device. For example, as the input section 34, an operation section such as a slide pad, an analog stick, a directional pad, an operation button, or the like may be provided on the side surfaces, the back surface, or the like of the main body of the information processing apparatus 3. Further, the input section 34 may be a sensor for detecting the orientation and the motion of the main body of the information processing apparatus 3. For example, the input section 34 may be an acceleration sensor for detecting the acceleration generated in the main body of the information processing apparatus 3, an angular velocity sensor (a gyro sensor) for detecting the amount of rotation of the main body of the information processing apparatus 3, or the like.

The sound output section 36 includes loudspeakers for outputting sounds, and in the example shown in FIG. 1, includes a pair of stereo loudspeakers (a left loudspeaker 36L and a right loudspeaker 36R) provided on the left and right of the upper side surface or the back surface of the information processing apparatus 3. The sound output section 36 performs D/A conversion on sound signals (a left sound control signal and a right sound control signal) output from a control section 31 described later, thereby generating analog sound signals (a left analog sound signal and a right analog sound signal). Then, the sound output section 36 outputs the analog sound signals to the loudspeakers (e.g., the stereo loudspeakers), thereby outputting sounds.

The actuator 373 is a vibration actuator (a vibrator) for imparting predetermined vibrations to the main body of the information processing apparatus 3 and is included in a vibration generation section 37 described later. In the example shown in FIG. 1, the actuator 373 includes a left actuator 373L, which is provided on the left and inside the main body of the information processing apparatus 3, and a right actuator 373R, which is provided on the right and inside the main body of the information processing apparatus 3. Specifically, as indicated by dashed line areas in FIG. 1, the left actuator 373L is provided on the left side of the display section 35, which is a position near the left hand of the user when holding a left end portion of the information processing apparatus 3 with the left hand. Further, the right actuator 373R is provided on the right side of the display section 35, which is a position near the right hand of the user when holding a right end portion of the information processing apparatus 3 with the right hand. Further, the vibration generation section 37 performs D/A conversion on vibration control signals (a left vibration control signal and a right vibration control signal) output from the control section 31 described later, thereby generating analog vibration signals (a left analog vibration signal and a right analog vibration signal). Then, the vibration generation section 37 outputs driving signals obtained by amplifying the analog vibration signals to the actuator 373 (the left actuator 373L and the right actuator 373R), thereby driving the actuator 373.

It should be noted that as is clear from FIG. 1, the display screen of the display section 35, the left sound output section 36L, and the right sound output section 36R, which are provided in the information processing apparatus 3, are placed at positions close to one another. The display screen of the display section 35, the left actuator 373L, and the right actuator 373R are placed at positions close to one another. Further, the left sound output section 36L and the left actuator 373L are placed at positions close to each other, but are different units disposed at different positions. The right sound output section 36R and the right actuator 373R are placed at positions close to each other, but are different units disposed at different positions. Consequently, it is possible to include a unit dedicated to outputting vibrations and a unit dedicated to outputting sounds. Thus, it is possible to output vibrations and sounds more accurately than when a general-purpose unit is shared. It should be noted that modules into which a unit for outputting vibrations and a unit for outputting sounds are combined and integrated may be provided on the left and right of the information processing apparatus 3.

Figure 2:
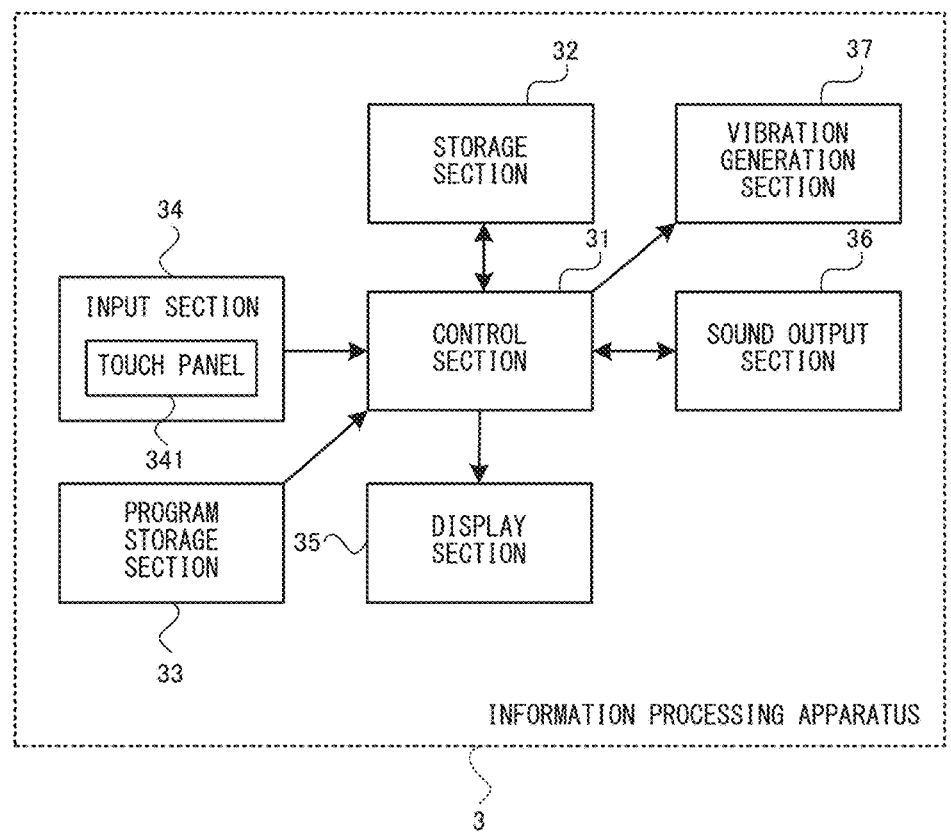
FIG. 2 is a block diagram showing a non-limiting example of the configuration of the information processing apparatus 3.

Next, with reference to FIG. 2, the internal configuration of the information processing apparatus 3 is described. It should be noted that FIG. 2 is a block diagram showing an example of the configuration of the information processing apparatus 3.

In FIG. 2, the information processing apparatus 3 includes the control section 31, a storage section 32, and a program storage section 33 in addition to the input section 34, the display section 35, the sound output section 36, and the vibration generation section 37, which are described above. It should be noted that the information processing apparatus 3 may be composed of one or more apparatuses including: an information processing apparatus having at least the control section 31; and another apparatus.

The control section 31 is information processing means (a computer) for performing various types of information processing and is, for example, a CPU. The control section 31 has the function of performing, as the various types of information processing, processing or the like corresponding to an operation performed on the input section 34 by the user. For example, the functions of the control section 31 are achieved by, for example, the CPU executing a predetermined program.

As the various types of information processing, the control section 31 controls the display of an image to be displayed on the display section 35. Further, as the various types of information processing, the control section 31 outputs, to the sound output section 36, sound control signals (e.g., digital sound signals) for controlling sounds to be output from the stereo loudspeakers. Further, as the various types of information processing, the control section 31 outputs, to the vibration generation section 37, vibration control signals (e.g., digital vibration signals) for controlling vibrations of the actuator 373 (the left actuator 373L and the right actuator 373R). Further, when adjusting the output gain of the vibration generation section 37 for vibrating the actuator 373 in accordance with a user operation, the control section 31 generates output gain adjustment instruction data based on an amount of adjustment set in accordance with the user operation and outputs the generated output gain adjustment instruction data to the vibration generation section 37.

The storage section 32 stores various data to be used when the control section 31 performs the above information processing. The storage section 32 is, for example, a memory accessible by the CPU (the control section 31).

The program storage section 33 stores a program. The program storage section 33 may be any storage device (storage medium) accessible by the control section 31. For example, the program storage section 33 may be a storage device provided in the information processing apparatus 3 having the control section 31, or may be a storage medium detachably attached to the information processing apparatus 3 having the control section 31. Alternatively, the program storage section 33 may be a storage device (a server or the like) connected to the control section 31 via a network. The control section 31 (the CPU) may read a part or all of the program to the storage section 32 at appropriate timing and execute the read program.

Next, with reference to FIG. 3, the configuration of the vibration generation section 37 is described. It should be noted that FIG. 3 is a block diagram showing an example of the configuration of the vibration generation section 37.

In FIG. 3, the vibration generation section 37 includes a codec section 371, an amplification section 372, the left actuator (left vibrator) 373L, and the right actuator (right vibrator) 373R.

The codec section 371 acquires vibration control signals output from the control section 31 and performs a predetermined decoding process on the vibration control signals, thereby generating analog vibration signals. Then, the codec section 371 outputs the analog vibration signals to the amplification section 372. For example, if a plurality of actuators 373 are provided and independent vibrations are generated by the respective actuators 373 (e.g., the left actuator 373L and the right actuator 373R), the control section 31 outputs vibration control signals (e.g., a left vibration control signal CSL and a right vibration control signal CSR) for controlling vibrations in the respective actuators 373. In this case, the codec section 371 decodes the vibration control signals output from the control section 31, thereby generating analog vibration signals (e.g., a left analog vibration signal ASL and a right analog vibration signal ASR) for generating vibrations in the respective actuators 373. Then, the codec section 371 outputs the analog vibration signals to the amplification section 372.

The amplification section 372 amplifies the analog vibration signals output from the codec section 371, thereby generating driving signals for driving the actuator 373. Then, the amplification section 372 outputs the driving signals to the actuator 373. For example, if a plurality of actuators 373 are provided (e.g., if the left actuator 373L and the right actuator 373R are provided), the amplification section 372 increases changes in the amplitudes of the current and/or the voltage of each of the analog vibration signals (e.g., the left analog vibration signal ASL and the right analog vibration signal ASR) output from the codec section 371, thereby generating driving signals (e.g., a left driving signal DSL and a right driving signal DSR). Then, the amplification section 372 outputs the driving signals to the respective actuators 373 (e.g., the left actuator 373L and the right actuator 373R). It should be noted that when adjusting the output gain in accordance with an instruction from the control section 31, the amplification section 372 acquires output gain adjustment instruction data from the amplification section 372 and changes the output gain (e.g., an amplification factor for amplifying an analog vibration signal) in accordance with the acquired output gain adjustment instruction data.

The actuator 373 is driven in accordance with the driving signals output from the amplification section 372, thereby imparting vibrations corresponding to the driving signals to the main body of the information processing apparatus 3. For example, as shown in FIG. 1, the actuator 373 includes the left actuator 373L and the right actuator 373R, which are provided on the left side and the right side of the main body of the information processing apparatus 3 with respect to the center of the display screen of the display section 35. As an example, the left actuator 373L is placed in a part of the main body of the information processing apparatus 3 that is held by the user with the left hand, and the right actuator 373R is placed in a part of the main body of the information processing apparatus 3 that is held by the user with the right hand. Here, the method of the actuator 373 to impart vibrations to the main body of the information processing apparatus 3 may be any method. For example, the actuator 373 may use the method of generating vibrations by an eccentric motor (ERM: Eccentric Rotating Mass), the method of generating vibrations by a linear vibrator (LRA: Linear Resonant Actuator), the method of generating vibrations by a piezoelectric element, or the like. If the driving signals to be output from the amplification section 372 are generated in accordance with the method of the actuator 373 to generate vibrations, an actuator using any method can impart various vibrations to the user of the information processing apparatus 3.

It should be noted that in the configuration of the vibration generation section 37, one or more codec sections and one or more amplification sections may be provided. For example, a codec section and an amplification section can be provided in each of a plurality of actuators 373 that are provided. In the above description, an example has been used where driving signals for driving the actuator 373 are generated by amplifying the analog vibration signals generated by the codec section 371. Alternatively, the signals output from the codec section 371 to the amplification section 372 may be digital signals. For example, if the actuator 373 is driven by pulse width modulation (PWM) control, the codec section 371 may generate pulse signals for turning on and off the actuator 373. In this case, the signals output from the codec section 371 to the amplification section 372 are digital vibration signals for controlling the driving of the actuator 373 using pulse waves. Consequently, the amplification section 372 amplifies the digital vibration signals.

Figure 5:
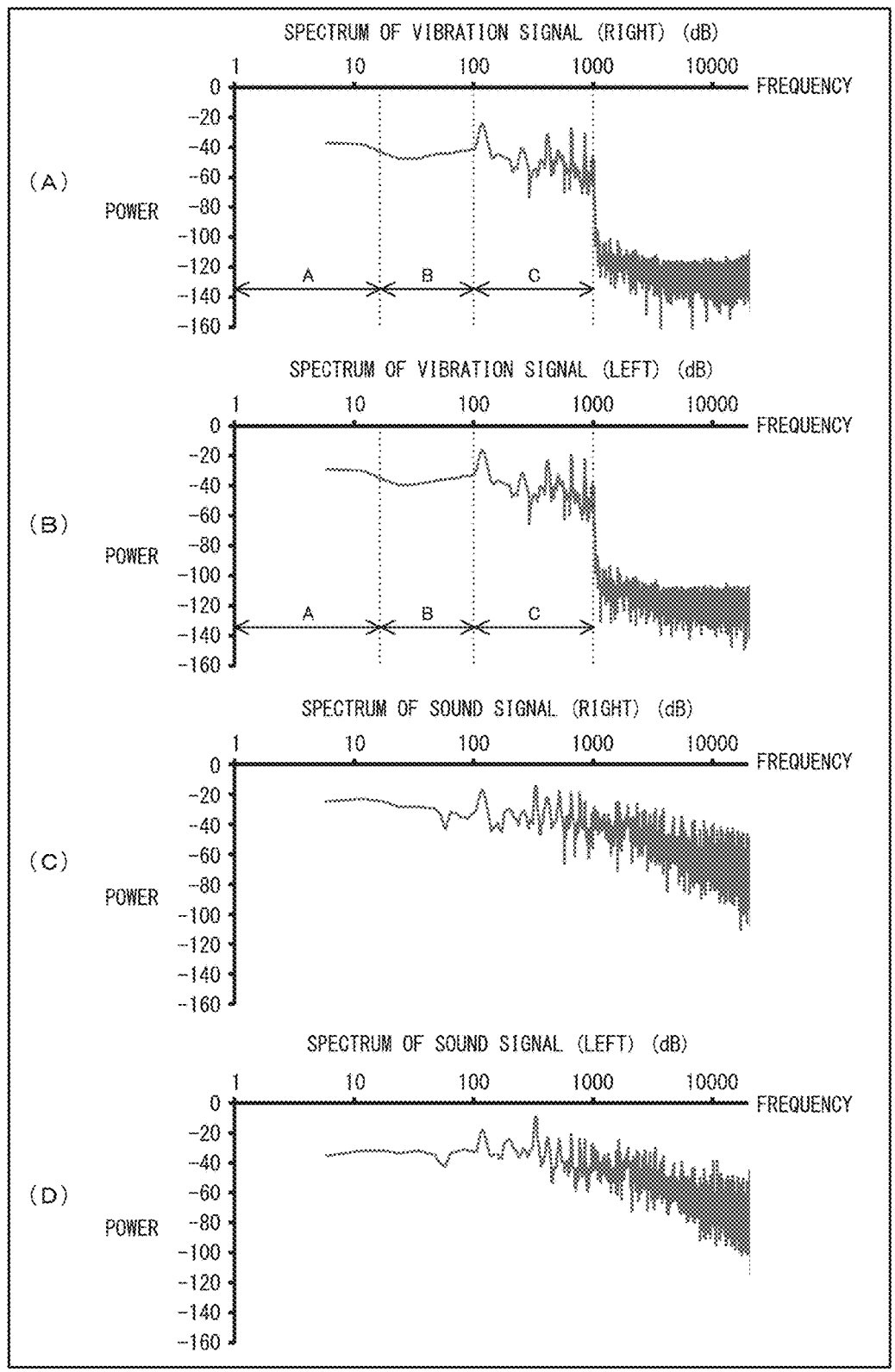
FIG. 5 is diagrams illustrating non-limiting examples of vibrations imparted to the main body of the information processing apparatus 3 and non-limiting examples of sounds output from the information processing apparatus 3.
Figure 6:
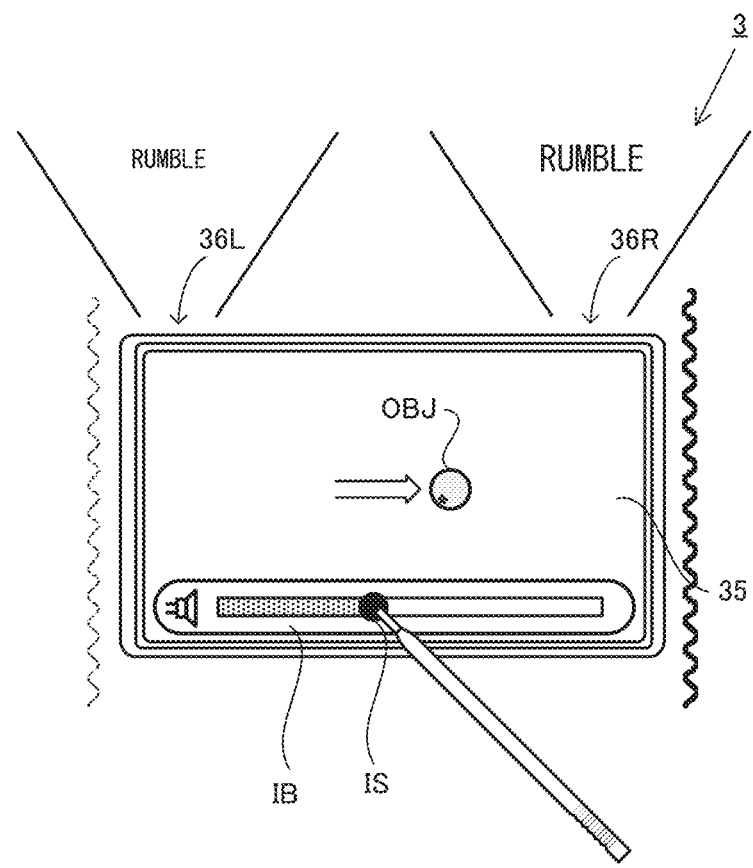
FIG. 6 is a diagram showing a non-limiting example where the sound volume and the magnitude of vibration change in accordance with a sound volume adjustment operation performed by a user.
Figure 7:
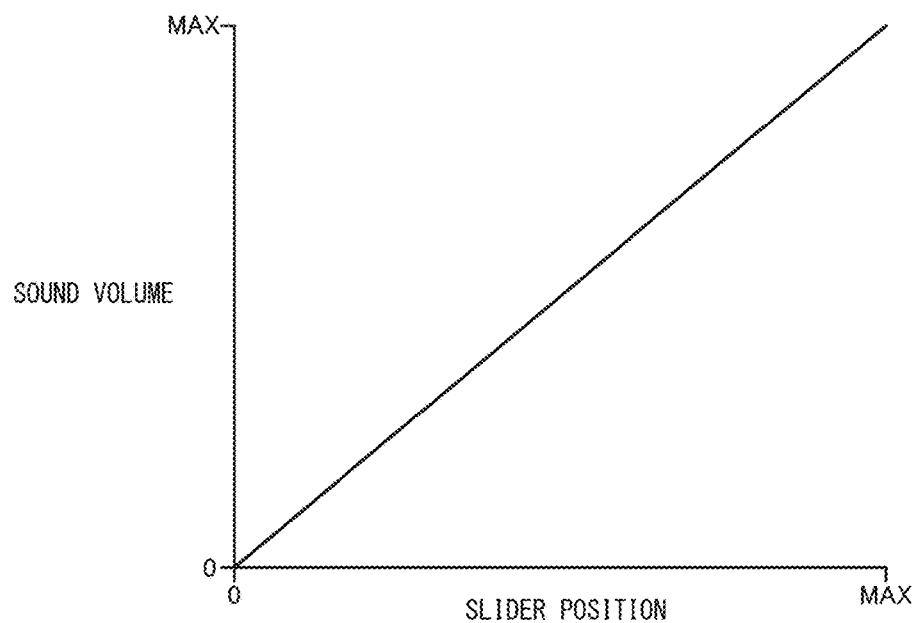
FIG. 7 is a graph showing a non-limiting example of the relationship between the position of a slider for performing a sound volume adjustment operation and the sound volume of output sound.
Figure 8:
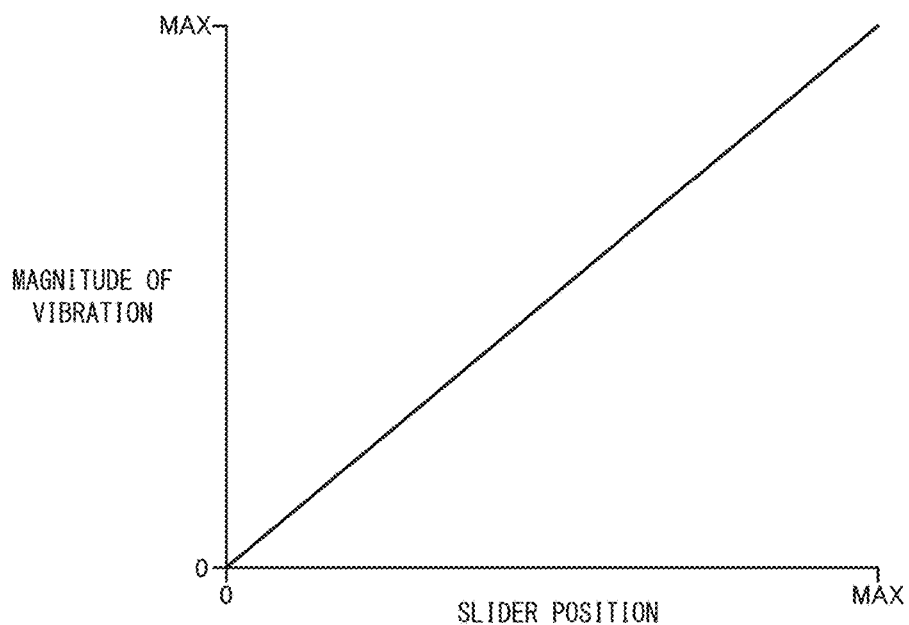
FIG. 8 is a graph showing a non-limiting example of the relationship between the position of the slider for performing a sound volume adjustment operation and the magnitude of vibration.

Next, with reference to FIGS. 4 to 8, a description is given of an overview of the processing performed by the information processing apparatus 3, before the description of specific processing performed by the information processing apparatus 3. In the following descriptions, the process of performing a game where a virtual object OBJ displayed on the display screen of the display section 35 is displayed so as to move is used as an example of the information processing performed by the information processing apparatus 3. It should be noted that FIG. 4 is a diagram showing an example where the above game is performed using the information processing apparatus 3. FIG. 5 is diagrams illustrating examples of the spectra of vibrations imparted to the main body of the information processing apparatus 3 and examples of the spectra of sounds output from the loudspeakers provided in the information processing apparatus 3, when the above game is performed. FIG. 6 is a diagram showing an example where the sound volume and the magnitude of vibration change in accordance with a sound volume adjustment operation performed by the user. FIG. 7 is a graph showing an example of the relationship between the position of a slider for performing a sound volume adjustment operation and the sound volume of output sound. FIG. 8 is a graph showing an example of the relationship between the position of the slider for performing a sound volume adjustment operation and the magnitude of vibration.

In FIG. 4, a virtual object OBJ placed in a virtual world is displayed on the display screen of the display section 35. The virtual object OBJ is displayed on the display screen of the display section 35 so as to move in the virtual world in accordance with a user operation or automatically.

In accordance with the movement of the virtual object OBJ, the main body of the information processing apparatus 3 vibrates and simultaneously, sounds are output from the loudspeakers. For example, in accordance with the display position of the virtual object OBJ displayed on the display screen of the display section 35, the left actuator 373L and the right actuator 373R, which are provided in the main body of the information processing apparatus 3, generate vibrations to occur when the virtual object OBJ moves. As an example, with the use of phantom sensation that stimulates two different points in the user's skin (specifically, the left hand and the right hand of the user holding the main body of the information processing apparatus 3) to cause the user to perceive a pseudo stimulus at one point, the left actuator 373L and the right actuator 373R impart, to the user of the information processing apparatus 3, vibrations for causing the user to perceive the display position of the virtual object OBJ as the vibration source in a pseudo manner (vibrations for causing the display position of the virtual object OBJ to be the position where a pseudo force sense is presented). Further, the pair of stereo loudspeakers (the left sound output section 36L and the right sound output section 36R) provided in the main body of the information processing apparatus 3 output sounds such that the position where the sound sources are localized is the display position of the virtual object OBJ displayed on the display screen of the display section 35. As described above, the display position of the virtual object OBJ, the position to be perceived as the vibration source in a pseudo manner (a pseudo force sense presentation position), and the sound source localization position are substantially matched. This can provide a realistic experience using visual sensation, tactile sensation, and auditory sense to the user. Further, vibrations imparted by the left actuator 373L and the right actuator 373R and sounds output from the left sound output section 36L and the right sound output section 36R are generated by imitating the vibrations and sounds when the virtual object OBJ moves. This can further enhance the reality.

For example, vibrations different from each other are imparted by the left actuator 373L and the right actuator 373R to the main body of the information processing apparatus 3 in a predetermined balance, thereby achieving the above phantom sensation. For example, if the virtual object OBJ is displayed so as to move in an area to the left of the center of the display screen of the display section 35, the amplitude of the vibration imparted by the left actuator 373L to the main body of the information processing apparatus 3 is greater than the amplitude of the vibration imparted by the right actuator 373R to the main body of the information processing apparatus 3. Thus, the vibration to be imparted from the left side is made stronger than the vibration to be imparted from the right side, whereby it is possible to cause the user to perceive as the vibration source the position on the left of the display screen where the virtual object OBJ is displayed so as to move.

Here, as shown in FIG. 5, in the exemplary game, each of the left actuator 373L and the right actuator 373R imparts a vibration having a plurality of frequency components (a vibration having not only a single frequency component) to the main body of the information processing apparatus 3, and each of the loudspeakers outputs a sound having a plurality of frequency components. For example, (A) of FIG. 5 and (B) of FIG. 5 show examples of the spectra of the vibrations imparted to the main body of the information processing apparatus 3 in the above exemplary game and indicate that a vibration in a frequency range having a predetermined width (a vibration in a wide band) is imparted by each of the left actuator 373L and the right actuator 373R to the main body of the information processing apparatus 3. More specifically, a vibration having power in the entire area of the frequency range from a frequency component lower than 10 Hz (hertz) to a frequency component higher than 1 kHz (kilohertz) is imparted by each of the left actuator 373L and the right actuator 373R to the main body of the information processing apparatus 3. Here, the sensory receptors of a human being for receiving cutaneous sensation include Merkel discs, Meissner corpuscles, Pacinian corpuscles, Ruffini endings, and the like. The Merkel discs are regarded as responding to vibrations at 0 to 200 Hz. The Meissner corpuscles are regarded as responding to vibrations at 20 to 100 Hz and regarded as having the highest sensitivity to vibrations near 30 Hz. The Pacinian corpuscles are regarded as responding to vibrations at 100 to 300 Hz and regarded as having the highest sensitivity to vibrations near 200 Hz. The vibrations imparted by the left actuator 373L and the right actuator 373R to the main body of the information processing apparatus 3 include vibrations in the frequency range of 0 to 1 kHz, which is regarded as being able to be felt by a human being or include part of vibrations in this frequency range, and also include frequency components to which these sensory receptors can respond (frequency components in areas A to C shown in (A) of FIG. 5 and (B) of FIG. 5). This makes it possible to reproduce a touch rich in reality and present the touch to the user.

In addition, as shown in FIG. 5, vibrations that can be imparted to the user of the information processing apparatus 3 and sounds that are output from the information processing apparatus 3 can have different spectra. For example, the information processing apparatus 3 can impart, to the user, vibrations around a wide band of 0 to 1000 Hz, which is regarded as being able to be felt by a human being, and can also output sounds around a wide band of 20 to 20000 Hz, which include audio frequencies audible to the human ear. Thus, the vibrations and the sounds can have different spectra by controlling different vibrators (the left actuator 373L, the right actuator 373R, and the stereo loudspeakers) by different control signals.

In the exemplary embodiment, vibration data for imparting vibrations to the main body of the information processing apparatus 3 and sound data for outputting sounds from the information processing apparatus 3 may be prepared separately in advance. In this case, vibration data corresponding to the type of vibrations to be imparted to the main body of the information processing apparatus 3 is extracted and read from the prepared vibration data, thereby generating vibration control signals. Further, sound data corresponding to sounds to be output from the information processing apparatus 3 is extracted and read from the prepared sound data, thereby generating sound control signals. It should be noted that in the vibration data, vibration data for imparting a vibration from the left actuator 373L and vibration data for imparting a vibration from the right actuator 373R may be prepared separately. As an example, a pair of left and right pieces of vibration data may be prepared in advance based on the position of the vibration source. Then, when vibrations are imparted to the main body of the information processing apparatus 3, a pair of left and right pieces of vibration data corresponding to the position to be perceived as the vibration source may be read. Further, it goes without saying that also in the sound data, sound data for outputting a sound from the left loudspeaker and sound data for outputting a sound from the right loudspeaker may be prepared separately. Further, sound data prepared in advance may be used as vibration data. Sound data is also data used to vibrate and drive a diaphragm of a loudspeaker and therefore can be used as data for vibrating and driving a vibrator (i.e., vibration data).

In addition, in the exemplary embodiment, a vibration control signal (the left vibration control signal CSL) for driving the left actuator 373L and a vibration control signal (the right vibration control signal CSR) for driving the right actuator 373R may be generated independently of each other, or may be generated by processing a single vibration control signal. For example, in the second case, a single vibration control signal prepared in advance in accordance with the intensity of the vibration for vibrating each actuator can be processed, thereby generating the left vibration control signal CSL and the right vibration control signal CSR.

Next, with reference to FIG. 6, a description is given of an example where the sound volume and the magnitude of vibration change based on a sound volume adjustment operation performed by the user. In accordance with a predetermined operation, an operation image IB, which is used by the user to adjust the sound volume, is displayed on the display screen of the display section 35. In the example shown in FIG. 6, as the operation image IB, a gauge image indicating the currently set sound volume level and a slider image IS, which allows a change in the sound volume level, are displayed together.

The slider image IS can be moved along the gauge image in accordance with a user operation using the input section 34 (typically, a touch operation on the touch panel 341), and the sound volume level to be set can be changed in accordance with the movement of the slider image IS. For example, the user touches a position on the touch panel 341 that overlaps the slider image IS, and performs a drag operation in a direction along the gauge image, whereby the slider image IS moves on the gauge image. Then, the sound volume level is set in accordance with the position of the slider image IS relative to the gauge image, and the output gain of sound to be output from the information processing apparatus 3 is adjusted based on the set sound volume level.

In the exemplary embodiment, in accordance with the above sound volume adjustment operation performed by the user, also the magnitude of vibration to be imparted to the user of the information processing apparatus 3 is simultaneously adjusted. Specifically, if the sound volume level has been adjusted to increase by a user operation using the input section 34, the output gain for vibrating the actuator is adjusted so that the magnitude of vibration to be imparted to the user of the information processing apparatus 3 increases in accordance with the adjustment of the output gain. If, on the other hand, the sound volume level has been adjusted to decrease by a user operation using the input section 34, the output gain for vibrating the actuator is adjusted so that the magnitude of vibration to be imparted to the user of the information processing apparatus 3 decreases in accordance with the adjustment of the output gain.

As an example, as shown in FIG. 7, in accordance with the movement of the slider image IS along the gauge image from the position of a minimum sound volume level (typically, a sound volume level of 0) to the position of a maximum sound volume level MAX, the sound volume linearly increases from a minimum sound volume (typically, a sound volume of 0) to a maximum sound volume MAX. Further, as shown in FIG. 8, in accordance with the movement of the slider image IS along the gauge image from the position of the minimum sound volume level to the position of the maximum sound volume level MAX, the magnitude of vibration linearly increases from a minimum vibration magnitude (typically, a vibration magnitude of 0) to a maximum vibration magnitude MAX.

It should be noted that in the examples shown in FIGS. 7 and 8, the relationship between the position of the slider image IS and the sound volume or the magnitude of vibration is linear, but may be another relationship. In the exemplary embodiment, adjustments may be made based on any relationship so long as the magnitude for vibrating the actuator is adjusted to increase and/or decrease simultaneously with the sound volume that increases and/or decreases in accordance with a user operation performed on a single type of input means. For example, the relationship between the position of the slider image IS and the sound volume or the magnitude of vibration may be a relationship other than a linear relationship, or may be a relationship based on a function represented by a quadratic function, a high-dimensional function of three or more dimensions, or another curve. Further, the relationship may be such that at positions, in the slider image IS, indicating values within a predetermined range, the sound volume or the magnitude of vibration is constant.

In addition, the method for adjusting the magnitude of vibration to be imparted to the user of the information processing apparatus 3 may be any method. As an example, an output gain in the vibration generation section 37 (e.g., an amplification factor for amplifying an analog vibration signal in the amplification section 372) may be adjusted, thereby adjusting the magnitude of vibration to be imparted to the user of the information processing apparatus 3. As another example, the magnitude of vibration per se indicated by the vibration control signals to be output from the control section 31 may be adjusted, thereby adjusting the magnitude of vibration to be imparted to the user of the information processing apparatus 3.

In addition, in the above description, an example has been used where the sound volume and the magnitude of vibration are adjusted using the operation image IB displayed on the display screen of the display section 35. Alternatively, the sound volume and the magnitude of vibration may be adjusted using another type of operation means. For example, if the input section 34 for adjusting the sound volume (e.g., an operation button, a slide switch, or the like) is provided on the side surface or the back surface of the main body of the information processing apparatus 3, the magnitude of vibration may also be adjusted simultaneously in accordance with a sound volume adjustment operation on the input section 34. Further, if the configuration is such that the sound volume can be adjusted by changing or moving the orientation of the main body of the information processing apparatus 3, the magnitude of vibration may also be adjusted simultaneously in accordance with the amount of adjustment of the sound volume.

In addition, in the above exemplary game, the position to be perceived as the vibration source and the position where the sound sources are localized are set in accordance with the position of the virtual object OBJ moving in the virtual world. Alternatively, the position to be perceived as the vibration source in the exemplary embodiment does not need to be the position of an image displayed so as to move. For example, the vibrations to be imparted by the left actuator 373L and the right actuator 373R and the sounds to be output from the loudspeakers may be controlled so that a virtual object fixedly displayed on the display screen of the display section 35 is the vibration source and the sound source. Further, if an image obtained by capturing the real world is displayed on the display screen of the display section 35, the vibrations to be imparted by the left actuator 373L and the right actuator 373R and the sounds to be output from the loudspeakers may be controlled so that the position of a captured object in the real world that appears in the image is the vibration source and the sound source. Further, the vibrations to be imparted by the left actuator 373L and the right actuator 373R and the sounds to be output from the loudspeakers may be controlled regardless of an image displayed on the display screen of the display section 35 (e.g., in the state where the display screen of the display section 35 is not displayed). Further, even in the case of an information processing apparatus 3 not including the display section 35, the vibrations to be imparted by the left actuator 373L and the right actuator 373R and the sounds to be output from the loudspeakers may be controlled.

In addition, in the above exemplary game, an example has been used where vibrations, each having a plurality of frequency components, are imparted to the main body of the information processing apparatus 3, and simultaneously, sounds, each having a plurality of frequency components, are output. Alternatively, other vibrations may be imparted to the main body of the information processing apparatus 3, or other sounds may be output. For example, vibrations, each having a single frequency component, may be imparted to the main body of the information processing apparatus 3, and sounds, each having a single frequency component, may be output.

Figure 9:
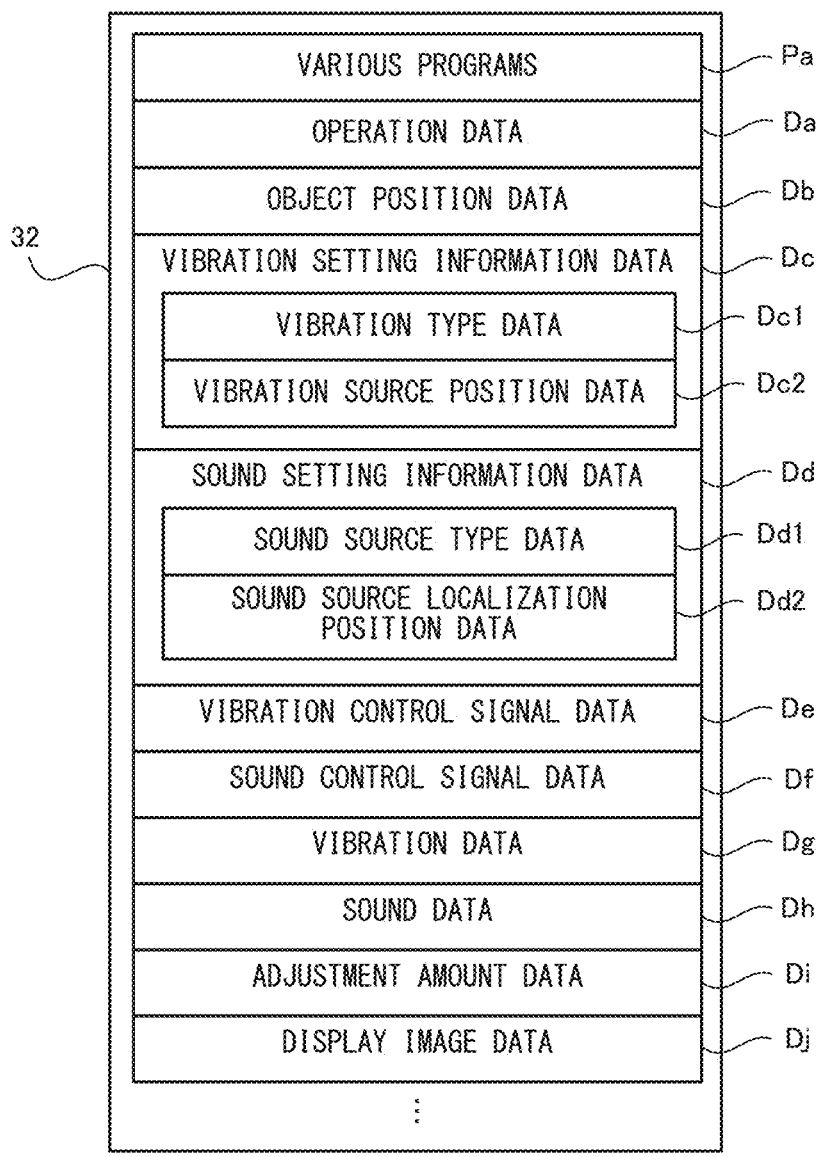
FIG. 9 is a diagram showing non-limiting examples of main data and programs stored in a storage section 32 of the information processing apparatus 3.

Next, a detailed description is given of the processing performed by the information processing apparatus 3. First, with reference to FIG. 9, main data used in the processing is described. FIG. 9 is a diagram showing examples of main data and programs stored in the storage section 32 of the information processing apparatus 3. It should be noted that in the following exemplary processing, a description is given using the information processing when the game processing of the above exemplary game is performed.

As shown in FIG. 9, the following are stored in the data storage area of the storage section 32: operation data Da; object position data Db; vibration setting information data Dc; sound setting information data Dd; vibration control signal data De; sound control signal data Df; vibration data Dg; sound data Dh; adjustment amount data Di; display image data Dj; and the like. It should be noted that the storage section 32 may store, as well as the data shown in FIG. 9, data and the like necessary for the processing, such as data used in an application to be executed. Further, in the program storage area of the storage section 32, various programs Pa included in the information processing program are stored. For example, the various programs Pa include a vibration generation program for generating vibration control signals to impart vibrations to the information processing apparatus 3, a sound generation program for generating sound control signals to output sounds from the information processing apparatus 3, an image display program for displaying an image on the display section 35, and the like.

The operation data Da is data representing the content of the operation performed on the input section 34 and includes, for example, data representing the touch position of a touch operation on the touch panel 341. It should be noted that if the input section 34 includes a sensor for detecting the orientation and the motion of the main body of the information processing apparatus 3, the operation data Da may include data for calculating the orientation and the motion of the main body of the information processing apparatus 3 (e.g., data representing the acceleration generated in the main body of the information processing apparatus 3 and data representing the angular velocity of the main body of the information processing apparatus 3).

The object position data Db is data representing the position of a virtual object OBJ moving in a virtual world (see FIGS. 4 and 6).

The vibration setting information data Dc includes vibration type data Dc1, vibration source position data Dc2, and the like. The vibration type data Dc1 is data representing the type of vibrations to be imparted to the information processing apparatus 3. The vibration source position data Dc2 is data representing the position to be perceived as the vibration source by the user of the information processing apparatus 3.

The sound setting information data Dd includes sound source type data Dd1, sound source localization position data Dd2, and the like. The sound source type data Dd1 is data representing the type of sounds to be output from the information processing apparatus 3. The sound source localization position data Dd2 is data representing the sound source localization position of sounds to be output from the information processing apparatus 3.

The vibration control signal data De is data representing vibration control signals to be output from the control section 31 to the vibration generation section 37 (the left vibration control signal CSL and the right vibration control signal CSR; see FIG. 3). The sound control signal data Df is data representing sound control signals to be output from the control section 31 to the sound output section 36 (the left sound control signal and the right sound control signal).

The vibration data Dg is data prepared in advance for generating vibration control signals and is stored for each type of vibration to be imparted to the main body of the information processing apparatus 3 (e.g., for each virtual object for which vibrations are generated). The sound data Dh is data prepared in advance for generating sound control signals and is stored for each type of sound to be output from the information processing apparatus 3 (e.g., for each virtual object for which sounds are produced or each type of BGM).

The adjustment amount data Di is data representing the amount of adjustment of each of the sound volume and the magnitude of vibration adjusted by a user operation. For example, if the user slides the slider image IS, provided in the operation image IB, to adjust the sound volume level (see FIG. 6), the amount of adjustment of each of the sound volume and the magnitude of vibration is set in accordance with the position of the slider image IS.

The display image data Dj is data for generating an image of each virtual object such as the virtual object OBJ, a background image, and the like and displaying the generated images on the display section 35.

Figure 10:
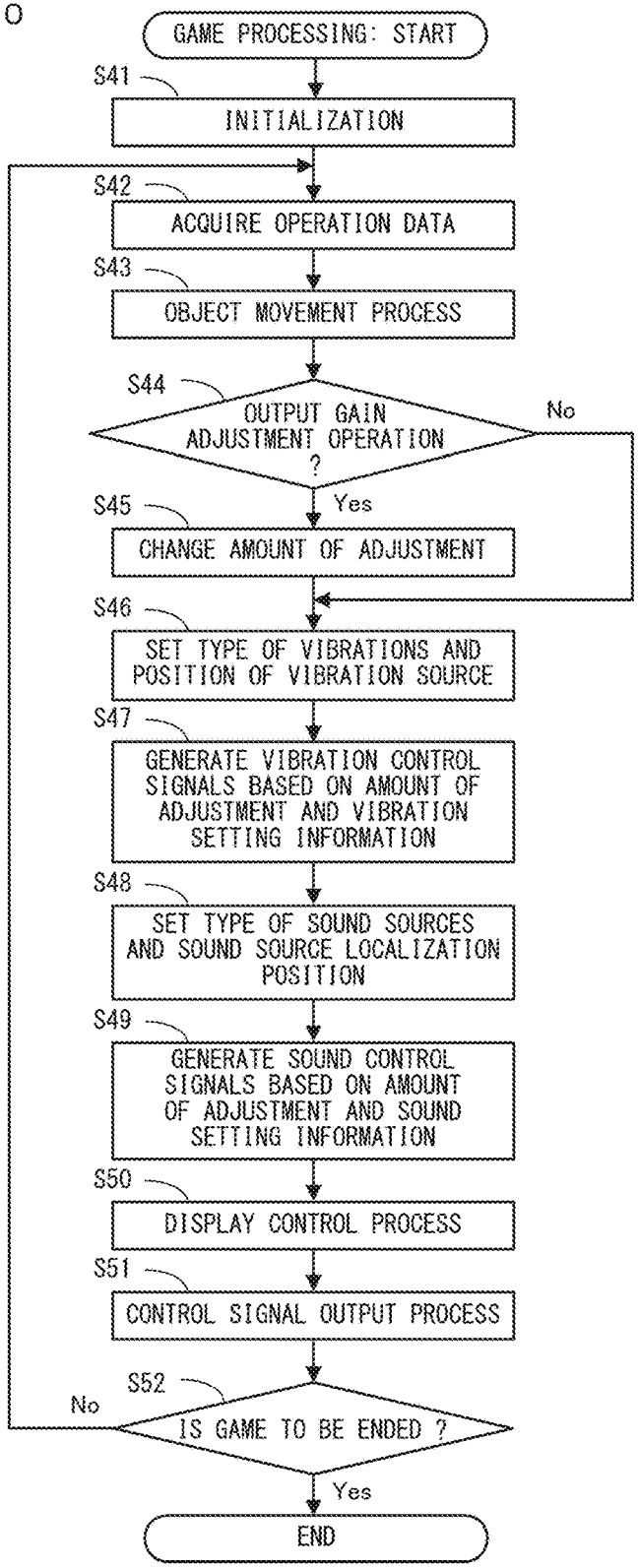
FIG. 10 is a flow chart showing a non-limiting example of game processing performed by the information processing apparatus 3.

Next, with reference to FIG. 10, a detailed description is given of the game processing, which is an example of the information processing performed by the information processing apparatus 3. It should be noted that FIG. 10 is a flow chart showing an example of the game processing performed by the information processing apparatus 3. Here, in the flow chart shown in FIG. 10, a description is given mainly of, in the processing performed by the information processing apparatus 3, the process of outputting vibrations and sounds corresponding to the movement of the virtual object OBJ in the virtual world in the above exemplary game. The detailed descriptions of other processes not directly related to these processes are omitted. Further, in FIG. 10, all of the steps performed by the control section 31 are abbreviated as "S".

The CPU of the control section 31 initializes a memory and the like of the storage section 32 and loads the information processing program from the program storage section 33 into the memory. Then, the CPU starts the execution of the information processing program. The flow chart shown in FIG. 10 is a flow chart showing the processing performed after the above processes are completed.

It should be noted that the processes of all of the steps in the flow chart shown in FIG. 10 are merely illustrative. Thus, the processing order of the steps may be changed, or another process may be performed in addition to and/or instead of the processes of all of the steps, so long as similar results are obtained. Further, in the exemplary embodiment, the CPU may perform the processes of some of the steps in the flow chart, and a processor or a dedicated circuit other than the CPU may perform the processes of the other steps. Yet alternatively, a processor or a dedicated circuit other than the CPU may perform the processes of all of the steps in the flow chart.

Referring to FIG. 10, the control section 31 performs initialization (step 41), and proceeds to the next step. For example, the control section 31 constructs a virtual world to be displayed on the display section 35 and initializes parameters. As an example, the control section 31 places the virtual object OBJ at an initial position in the virtual world and sets the object position data Db. Further, the control section 31 sets the display range to be displayed on the display screen of the display section 35 for the virtual world. Further, the control section 31 sets the amount of adjustment of the sound volume level to a default value determined in advance or a value set before the initialization (e.g., a value set in information processing such as game processing performed before the start of the game) and initializes the adjustment amount data Di using the set amount of adjustment.

Next, the control section 31 acquires operation data from the input section 34 and updates the operation data Da (step 42), and the processing proceeds to the next step.

Next, the control section 31 performs the process of causing the virtual object OBJ to move in the virtual world (step 43), and the processing proceeds to the next step. For example, the control section 31 causes the virtual object OBJ to move at a moving speed determined in advance along a movement path determined in advance in the virtual world and updates the object position data Db using the position of the virtual object OBJ after the movement. As another example, if the control section 31 causes the virtual object OBJ to move in accordance with an operation on the input section 34 (including the operation of moving or tilting the main body of the information processing apparatus 3), the control section 31 causes the virtual object OBJ to move in the virtual world in accordance with the operation data acquired in the above step 42 and updates the object position data Db using the position of the virtual object OBJ after the movement.

Next, the control section 31 determines, based on the operation data Da, whether or not an output gain adjustment operation has been performed using the input section 34 (step 44). For example, when the sound volume level is adjusted by the operation of sliding the slider image IS provided in the operation image IB (see FIG. 6) and if the operation of moving the slider image IS (e.g., a touch operation for dragging the slider image on the touch panel 341) has been performed, the control section 31 determines that the output gain adjustment operation has been performed. Then, if the output gain adjustment operation has been performed, the processing proceeds to step 45. If, on the other hand, the output gain adjustment operation has not been performed, the processing proceeds to step 46.

In step 45, the control section 31 sets a new amount of adjustment in accordance with the output gain adjustment operation performed using the input section 34, and the processing proceeds to step 46. For example, the control section 31 sets an amount of adjustment in accordance with the position of the slider image IS having moved in accordance with the output gain adjustment operation. As an example, based on a function as shown in FIG. 7, the control section 31 sets an amount of adjustment of the sound volume corresponding to the position of the slider image IS after the movement, thereby updating the adjustment amount data Di regarding the sound volume. Further, based on a function as shown in FIG. 8, the control section 31 sets an amount of adjustment of the magnitude of vibration corresponding to the position of the slider image IS after the movement, thereby updating the adjustment amount data Di regarding the magnitude of vibration. It should be noted that the amount of adjustment of the sound volume and the amount of adjustment of the magnitude of vibration that are set in the above step 45 may be the same value or different values.

In step 46, the control section 31 sets the type of vibrations and the position of the vibration source, and the processing proceeds to the next step. For example, based on the vibration generation program and the type of the virtual object OBJ placed in the virtual world, the control section 31 sets the type of vibrations when the virtual object OBJ moves. Then, the control section 31 updates the vibration type data Dc1 using data representing the type of vibrations. Further, based on the vibration generation program, the control section 31 sets the position of the vibration source such that the position of the virtual object OBJ indicated by the object position data Db is perceived as the vibration source by the user. Then, the control section 31 updates the vibration source position data Dc2 using data representing the set position.

Next, based on the amount of adjustment of the magnitude of vibration and vibration setting information, the control section 31 sets vibration control signals (step 47), and the processing proceeds to the next step. For example, based on the vibration generation program and the vibration setting information data Dc (the vibration type data Dc1 and the vibration source position data Dc2), the control section 31 generates vibration control signals (the left vibration control signal CSL and the right vibration control signal CSR to be output to the vibration generation section 37; see FIG. 3) using vibration data read from the vibration data Dg and stores the vibration control signals in the vibration control signal data De. Specifically, the control section 31 reads data from the vibration data Dg and generates the left vibration control signal CSL and the right vibration control signal CSR corresponding to the vibrations of the type indicated by the vibration type data Dc1, so that the vibrations of the type indicated by the vibration type data Dc1 are imparted to the main body of the information processing apparatus 3, and the position indicated by the vibration source position data Dc2 is perceived as the vibration source of the vibrations. It should be noted that if the magnitude of vibration per se indicated by the vibration control signals is adjusted to adjust the magnitude of vibration to be imparted to the user of the information processing apparatus 3, the control section 31 adjusts the magnitude of vibration indicated by the vibration control signals in accordance with the amount of adjustment of the magnitude of vibration indicated by the adjustment amount data Di and stores the vibration control signals after the adjustment in the vibration control signal data De. If, on the other hand, an output gain in the vibration generation section 37 (e.g., an amplification factor for amplifying an analog vibration signal in the amplification section 372) is adjusted to adjust the magnitude of vibration to be imparted to the user of the information processing apparatus 3, the control section 31 generates, based on the amount of adjustment of the magnitude of vibration indicated by the adjustment amount data Di, output gain adjustment instruction data for instructing the vibration generation section 37 to adjust the output gain and stores the output gain adjustment instruction data in the vibration control signal data De, aside from the vibration control signals.

Next, the control section 31 sets the type of sound sources and the position where the sound sources are localized (step 48), and the processing proceeds to the next step. For example, based on the sound generation program and the type of the virtual object OBJ placed in the virtual world, the control section 31 sets the type of sounds when the virtual object OBJ moves. Then, the control section 31 updates the sound source type data Dd1 using data representing the type of sounds. Further, based on the sound generation program, the control section 31 sets the sound source localization position such that the position of the virtual object OBJ indicated by the object position data Db is the sound source localization position of the sounds. Then, the control section 31 updates the sound source localization position data Dd2 using data representing the sound source localization position.

Next, based on the amount of adjustment of the magnitude of the sound volume and sound setting information, the control section 31 sets sound control signals (step 49), and the processing proceeds to the next step. For example, based on the sound generation program and the sound setting information data Dd (the sound source type data Dd1 and the sound source localization position data Dd2), the control section 31 generates sound control signals (the left sound control signal and the right sound control signal to be output to the sound output section 36) and stores the sound control signals in the sound control signal data Df. Specifically, the control section 31 reads data from the sound data Dh and generates the left sound control signal and the right sound control signal, so that the sounds of the type indicated by the sound source type data Dd1 are output from the stereo loudspeakers of the information processing apparatus 3, and the position indicated by the sound source localization position data Dd2 is the sound localization position. It should be noted that if the sound volume per se indicated by the sound control signals is adjusted to adjust the output sound volume, the control section 31 adjusts the sound volume indicated by the sound control signals in accordance with the amount of adjustment of the sound volume indicated by the adjustment amount data Di and stores the sound control signals after the adjustment in the sound control signal data Df. If, on the other hand, an output gain in the sound output section 36 (e.g., an amplification factor for amplifying an analog sound signal in an amplification section in the sound output section 36) is adjusted to adjust the output sound volume, the control section 31 generates, based on the amount of adjustment of the sound volume indicated by the adjustment amount data Di, output gain adjustment instruction data for instructing the sound output section 36 to adjust the output gain and stores the output gain adjustment instruction data in the sound control signal data Df, aside from the sound control signals.

Next, the control section 31 performs a display control process (step 50), and the processing proceeds to the next step. For example, based on an image generation program and the object position data Db, the control section 31 performs the process of generating an image of the virtual world in which the virtual object OBJ is placed, and displaying on the display section 35 the image of the virtual world in the set display range.

Next, the control section 31 performs a control signal output process (step 51), and the processing proceeds to the next step. For example, the control section 31 outputs to the vibration generation section 37 the left vibration control signal CSL and the right vibration control signal CSR indicated by the vibration control signal data De. Consequently, the vibration generation section 37 generates a vibration corresponding to the left vibration control signal CSL from the left actuator 373L and generates a vibration corresponding to the right vibration control signal CSR from the right actuator 373R. It should be noted that if the output gain adjustment instruction data is included in the vibration control signal data De, the control section 31 also outputs the output gain adjustment instruction data to the vibration generation section 37. Consequently, the vibration generation section 37 produces, from the left actuator 373L and the right actuator 373R, the vibrations corresponding to the left vibration control signal CSL and the right vibration control signal CSR by adjusting the vibrations to the output gain corresponding to the output gain adjustment instruction data. Further, the control section 31 outputs to the sound output section 36 the left sound control signal and the right sound control signal indicated by the sound control signal data Df. Consequently, the sound output section 36 outputs a sound corresponding to the left sound control signal from the left loudspeaker and outputs a sound corresponding to the right sound control signal from the right loudspeaker. It should be noted that if the output gain adjustment instruction data is included in the sound control signal data Df, the control section 31 also outputs the output gain adjustment instruction data to the sound output section 36. Consequently, the sound output section 36 outputs, from the left loudspeaker and the right loudspeaker, the sounds corresponding to the left sound control signal and the right sound control signal by adjusting the sounds to the output gain corresponding to the output gain adjustment instruction data.

Next, the control section 31 determines whether or not the game processing is to be ended (step 52). Examples of conditions for ending the game processing include: the satisfaction of the condition under which the game processing is ended; and the fact that the user has performed the operation of ending the game processing. If the game processing is not to be ended, the control section 31 returns to the above step 42 and repeats the process thereof. If the game processing is to be ended, the control section 31 ends the processing indicated by the flow chart.

As described above, in the game processing according to the above exemplary embodiment, in accordance with a user operation, the sound volume of sound to be output from the information processing apparatus 3 can be adjusted, and simultaneously, the magnitude of vibration to be imparted to the user by the information processing apparatus 3 can also be adjusted. As an example, even if the sound volume of sound to be output from the information processing apparatus 3 is minimized so that sound is not output to the periphery of the information processing apparatus 3, a vibration sound produced by the information processing apparatus 3 imparting vibration to the user may leak to the periphery of the information processing apparatus 3. However, the vibration to be imparted to the information processing apparatus 3 is adjusted simultaneously with the adjustment of the sound volume of sound. This also makes it possible to prevent the leakage of the vibration sound.

In addition, vibrations in a wide band imparted by the left actuator 373L and the right actuator 373R are imparted to the information processing apparatus 3, whereby it is possible to impart vibrations rich in variety to the main body of the apparatus. Further, in the game processing according to the above exemplary embodiment, it is possible to cause the user to perceive as the vibration source the position where the virtual object OBJ is placed in the virtual world. Here, in the game processing according to the above exemplary embodiment, sounds in a wide band when the virtual object OBJ moves are output such that the position where the virtual object OBJ is placed in the virtual world is the sound source localization position of the sounds output from the information processing apparatus 3. Further, if the virtual object OBJ is placed in the virtual world displayed on the display screen of the display section 35, the position where the virtual object OBJ is placed is displayed on the display screen of the display section 35. As described above, the position of the virtual object OBJ is presented using tactile sensation based on vibrations in a wide band, auditory sense based on sounds in a wide band, and visual sensation based on the display of a moving object on the display screen, whereby it is possible to impart unconventional bodily sensation rich in reality to the user. Further, in the game processing according to the above exemplary embodiment, the sound volume of sound to be output from the information processing apparatus 3 is adjusted, and simultaneously, the magnitude of vibration to be imparted to the user by the information processing apparatus 3 is adjusted. Thus, it is possible to avoid an imbalanced state where the magnitude of vibration does not change in response to the adjustment of the sound volume. This makes it possible to impart, to the user, bodily sensation that does not impair reality even with the sound volume adjusted.

It should be noted that the above descriptions are given using the example where the information processing apparatus 3 performs information processing (game processing). Alternatively, another apparatus may perform at least some of the processing steps in the information processing. For example, if the information processing apparatus 3 is further configured to communicate with another apparatus (e.g., another server, another game apparatus, or another mobile terminal), the other apparatus may cooperate to perform the processing steps of the information processing. As an example, another apparatus may perform at least one of the virtual world image generation process, the vibration control signal generation process, and the sound control signal generation process, and the information processing apparatus 3 may acquire image data and control signals indicating the result of the process. Another apparatus may thus perform at least some of the processing steps in the information processing, thereby enabling processing similar to the above information processing. Further, the above information processing can be performed by a processor or the cooperation of a plurality of processors, the processor or the plurality of processors included in an information processing system including at least one information processing apparatus. Further, in the above exemplary embodiment, the processing indicated in the above flow chart is performed by the control section 31 of the information processing apparatus 3 executing a predetermined game program. Alternatively, a part or all of the information processing indicated in the flow chart may be performed by a dedicated circuit included in the information processing apparatus 3.

Here, the above variations make it possible to achieve the exemplary embodiment also by a system form such as so-called cloud computing, or a system form such as a distributed wide area network or a local area network. For example, in a system form such as a distributed local area network, it is possible to execute the information processing between a stationary information processing apparatus (a stationary game apparatus) and a handheld information processing apparatus (a handheld game apparatus) by the cooperation of the apparatuses. It should be noted that, in these system forms, there is no particular limitation on which apparatus performs the process of each step of the above information processing. Thus, it goes without saying that it is possible to achieve the exemplary embodiment by sharing the processing in any manner.

In addition, the processing orders, the setting values, the conditions used in the determinations, and the like that are used in the above information processing are merely illustrative. Thus, it goes without saying that the exemplary embodiment can be achieved also with other orders, other values, and other conditions. Further, the shapes, the number, the placement positions, the functions, and the like of the components used by the above information processing apparatus are merely illustrative, and may be other shapes, number, and placement positions. It goes without saying that the exemplary embodiment can be achieved by the information processing apparatus having other functions. As an example, three or more actuators may impart vibrations to the information processing apparatus, or three or more loudspeakers may output sounds from the information processing apparatus. Alternatively, the information processing apparatus may include a plurality of display sections. Further, in the above description, a handheld apparatus (e.g., a tablet terminal) has been used as an example of the information processing apparatus 3. Alternatively, the information processing apparatus 3 may be a portable apparatus larger than a handheld apparatus. Here, a portable apparatus is an apparatus that allows the movement of the main body of the apparatus when the apparatus is used, or allows a change in the orientation of the main body of the apparatus when the apparatus is used, or allows the carrying around of the main body of the apparatus, and is a concept including the above handheld apparatus.

In addition, the information processing program may be supplied to the information processing apparatus 3 not only through an external storage medium such as the external memory 45, but also through a wired or wireless communication link. Further, the information processing program may be stored in advance in a non-volatile storage device included in the information processing apparatus 3. It should be noted that examples of an information storage medium having stored therein the information processing program may include CD-ROMs, DVDs, optical disk storage media similar to these, flexible disks, hard disks, magneto-optical disks, and magnetic tapes, as well as non-volatile memories. Alternatively, an information storage medium having stored therein the information processing program may be a volatile memory for storing the information processing program. It can be said that such a storage medium is a storage medium readable by a computer or the like. For example, it is possible to provide the above various functions by causing a computer or the like to load a game program from the storage medium and execute it.

While some exemplary systems, exemplary methods, exemplary devices, and exemplary apparatuses have been described in detail above, the above descriptions are merely illustrative in all respects, and do not limit the scope of the systems, the methods, the devices, and the apparatuses. It goes without saying that the systems, the methods, the devices, and the apparatuses can be improved and modified in various manners without departing the spirit and scope of the appended claims. It is understood that the scope of the systems, the methods, the devices, and the apparatuses should be interpreted only by the scope of the appended claims. Further, it is understood that the specific descriptions of the exemplary embodiment enable a person skilled in the art to carry out an equivalent scope on the basis of the descriptions of the exemplary embodiment and general technical knowledge. It should be understood that, when used in the specification, the components and the like described in the singular with the word "a" or "an" preceding them do not exclude the plurals of the components. Furthermore, it should be understood that, unless otherwise stated, the terms used in the specification are used in their common meanings in the field. Thus, unless otherwise defined, all the jargons and the technical terms used in the specification have the same meanings as those generally understood by a person skilled in the art in the field of the exemplary embodiment. If there is a conflict, the specification (including definitions) takes precedence.

As described above, the exemplary embodiment is useful as, for example, an information processing apparatus, an information processing program, an information processing system, an information processing method, and the like in order, for example, to adjust vibrations for vibrating a vibration apparatus in accordance with a user operation.

What is claimed is:

1. An information processing apparatus comprising:
   a hand-holdable housing;
   a speaker supplied with a sound signal corresponding to a display image;
   a vibrator, supplied with a vibration signal corresponding to the display image, for vibrating the housing; and
   one or more hardware processors configured to at least:
   generate the display image;
   accept input for setting an amount of adjustment;
   in accordance with the display image, generate the sound signal for supply to the speaker based on sound data, which is a source of sound to be output from the speaker, and the adjustment amount set by the input to thereby change a volume of sound to be output from the speaker; and
   in accordance with the display image, generate the vibration signal for supply to the vibrator based on vibration data, which is separate from the sound data and is a source of vibration to be imparted by the vibrator, and the adjustment amount set by the input to thereby change, simultaneously with the change in the volume of sound to be output from the speaker, a magnitude of vibration to be imparted by the vibrator to the housing.

2. The information processing apparatus according to claim 1, wherein
   the adjustment amount is set in accordance with a volume operation for adjusting sound volume of the information processing apparatus.

3. The information processing apparatus according to claim 1, wherein
   the sound signal is generated so that the sound volume of sound to be output from the speaker increases and/or decreases in accordance with an increase and/or a decrease in the adjustment amount, and
   the vibration signal is generated so that an intensity for vibrating the vibrator increases and/or decreases in accordance with the increase and/or the decrease in the adjustment amount.

4. The information processing apparatus according to claim 1, further comprising storage configured to store the sound data and the vibration data.

5. The information processing apparatus according to claim 1, further comprising a single input device for setting the adjustment amount.

6. The information processing apparatus according to claim 1, wherein
   the one or more hardware processors are configured so that the adjustment amount is settable while the speaker outputs sound and the vibrator is vibrating.

7. The information processing apparatus according to claim 1, wherein
   the vibration signal includes a signal in an audible range of frequencies.

8. The information processing apparatus according to claim 1, wherein
   the vibration signal has a plurality of frequency components.

9. The information processing apparatus according to claim 8, wherein
   the vibration signal controls the vibrator to vibrate in a frequency range having a predetermined width.

10. A non-transitory computer-readable storage medium having stored therein an information processing program which, when executed by a computer included in an information processing apparatus comprising a hand-holdable housing, a speaker supplied with a sound signal corresponding to a display image and a vibrator, supplied with a vibration signal corresponding to the display image, for vibrating the housing, causes the computer to perform operations comprising:
    generating the display image;
    accepting input for setting an amount of adjustment;
    in accordance with the display image, generating the sound signal for supply to the speaker based on sound data, which is a source of sound to be output from the speaker, and the adjustment amount set by the input to thereby change a volume of sound to be output from the speaker; and
    in accordance with the display image, generating the vibration signal for supply to the vibrator based on vibration data, which is separate from the sound data and is a source of vibration to be imparted by the vibrator, and the adjustment amount set by the input to thereby change, simultaneously with the change in the volume of sound to be output from the speaker, a magnitude of vibration to be imparted by the vibrator to the housing.

11. An information processing system including a plurality of apparatuses capable of communicating with each other, the information processing system comprising at least one apparatus including:
    a hand-holdable housing;
    a speaker supplied with a sound signal corresponding to a display image;
    a vibrator, supplied with a vibration signal corresponding to the display image, for vibrating the housing;
    one or more hardware processors configured to at least:
    generate the display image;
    accept input for setting an amount of adjustment;
    in accordance with the display image, generate the sound signal for supply to the speaker based on sound data, which is a source of sound to be output from the speaker, and the adjustment amount set by the input to thereby change a volume of sound to be output from the speaker; and
    in accordance with the display image, generate the vibration signal for supply to the vibrator based on vibration data, which is separate from the sound data and is a source of vibration to be imparted by the vibrator, and the adjustment amount set by the input to thereby change, simultaneously with the change in the volume of sound to be output from the speaker, a magnitude of vibration to be imparted by the vibrator to the housing.

12. An information processing method executed by a processor or by cooperation of a plurality of processors, the processor or the plurality of processors included in a system including at least one apparatus comprising a housing, a speaker supplied with a sound signal corresponding to a display image and a vibrator, supplied with a vibration signal corresponding to the display image, for vibrating the housing, the information processing method comprising:
    generating the display image;
    accepting input for setting an amount of adjustment;
    in accordance with the display image, generating the sound signal for supply to the speaker based on sound data, which is a source of sound to be output from the speaker, and the adjustment amount set by the input to thereby change a volume of sound to be output from the speaker; and
    in accordance with the display image, generating the vibration signal for supply to the vibrator based on vibration data, which is separate from the sound data and is a source of vibration to be imparted by the vibrator, and the adjustment amount set by the input to thereby change, simultaneously with the change in the volume of sound to be output from the speaker, a magnitude of vibration to be imparted by the vibrator to the housing.

\* \* \* \* \*